United States Patent
Gaun et al.

(10) Patent No.: US 7,221,599 B1
(45) Date of Patent: May 22, 2007

(54) POLYMER MEMORY CELL OPERATION

(75) Inventors: David Gaun, Brookline, MA (US); Juri H Krieger, Brookline, MA (US); Stuart Spitzer, Lynnfield, MA (US)

(73) Assignee: Spansion, LLC, Sunnyvale, CA (US)

( * ) Notice: Subject to any disclaimer, the term of this patent is extended or adjusted under 35 U.S.C. 154(b) by 120 days.

(21) Appl. No.: 10/978,621

(22) Filed: Nov. 1, 2004

(51) Int. Cl.
G11C 7/10 (2006.01)

(52) U.S. Cl. .................. 365/189.01; 365/151; 365/178

(58) Field of Classification Search .......... 365/189.01, 365/151, 178, 180, 200
See application file for complete search history.

(56) References Cited

U.S. PATENT DOCUMENTS

| | | | |
|---|---|---|---|
| 5,841,180 A | 11/1998 | Kobayashi et al. | |
| 5,942,775 A | 8/1999 | Yiannoulos | |
| 6,232,626 B1 | 5/2001 | Rhodes | |
| 6,245,601 B1 | 6/2001 | Kobayashi et al. | |
| 6,424,565 B2 | 7/2002 | Brug et al. | |
| 6,649,950 B2 | 11/2003 | He et al. | |
| 6,838,742 B2 | 1/2005 | Rhodes | |
| 6,839,275 B2 | 1/2005 | Van Brocklin et al. | |
| 6,870,183 B2 | 3/2005 | Tripsas | |
| 6,873,543 B2 | 3/2005 | Smith et al. | |
| 6,885,573 B2 | 4/2005 | Sharma et al. | |
| 6,900,488 B1 | 5/2005 | Lopatin | |
| 2003/0053350 A1* | 3/2003 | Krieger et al. | 365/200 |
| 2004/0160801 A1* | 8/2004 | Krieger et al. | 365/151 |
| 2004/0214365 A1* | 10/2004 | Joshi | 438/48 |
| 2005/0224922 A1* | 10/2005 | Lyons | 257/642 |
| 2006/0038169 A1* | 2/2006 | Mandell et al. | 257/40 |

\* cited by examiner

Primary Examiner—Richard T. Elms
Assistant Examiner—Dang Nguyen
(74) Attorney, Agent, or Firm—Amin, Turocy & Calvin, LLP

(57) ABSTRACT

Systems and methodologies are provided for activating a polymer memory cell(s) after production by subjecting the polymer memory cell to an electrical field, for an initialization thereof. Such initialization can facilitate the distribution and mobility of metal ions (or charged metallic molecules) within an active layer of the polymer memory cell. The memory cell can include various layers of alternating passive and active media, which are sandwiched between conducting electrode layers.

16 Claims, 11 Drawing Sheets

POLYMER MEMORY CELL OPERATION

TECHNICAL FIELD

The present invention relates generally to operation of memory cells, and in particular to an initialization process for activating and running a polymer memory cell after a fabrication stage.

BACKGROUND OF THE INVENTION

The volume, use and complexity of computers and electronic devices are continually increasing. Computers consistently become more powerful, and new and improved electronic devices are continually developed (e.g., digital audio players, video players). Additionally, the growth and use of digital media (e.g., digital audio, video, images, and the like) have further pushed development of these devices. Such growth and development have vastly increased the amount of information desired/required to be stored and maintained for computer and electronic devices. Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short-term storage mediums. Memory devices tend to be substantially faster than long-term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like.

Volatile memory devices generally provide faster operation at a lower cost as compared to non-volatile memory devices. Memory devices generally include arrays of memory cells. Each memory cell can be accessed or "read", "written", and "erased" with information. The memory cells can typically maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as crystalline silicon devices.

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like). Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. Typically, the volatile semiconductor memories based on inorganic semiconductor material must constantly be supplied with electric current with a resulting heating and high electric power consumption in order to maintain stored information.

Therefore, there is a need to overcome the aforementioned deficiencies associated with conventional systems

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter.

The present invention provides for systems and methods of activating a polymer memory cell(s) after a production thereof by employing an initialization process. Such initialization can facilitate the distribution and mobility of metal ions (or charged metallic molecules) within an active layer of the polymer memory cell. The memory cell can include various layers of alternating passive and active media, which are sandwiched between conducting electrode layers. Such active and passive layers facilitate migration of charges (e.g., electron and/or positive ions) between electrodes to induce a desired programming state (e.g., a write) in the polymer memory cell. Interconnecting vias can be employed to operatively tie various layers of one or more memory cells together.

In a related aspect, the initialization procedures of the present invention can affect threshold values, and subsequent programming of the polymer memory cell. The thresholds can for example designate a lower limit associated with a particular programming state for the polymer memory cell. Moreover, the present invention can facilitate controlling a distribution of various thresholds (e.g., write and erase thresholds), and set them to predetermined values.

In a further aspect of the present invention, after fabrication the polymer memory cell and/or array can be subject to an electric field to provide a supply of positive or negative ions within its polymer layer. Subsequently, the polymer or memory cell array can be subject to a hard erase to drive ions out of the polymer (e.g., by subjecting the polymer memory cell to an opposite negative or positive field having a strength of 3–6 mega volts per cm). Next, the polymer memory cell (or individual cells in the array) can programmed to a predetermined "On" state by providing a variable time duration positive or negative write pulse (e.g., a single "On" state can be achieved with a positive or negative field strength of 2–4 mega volts per cm, and a current of 1.0 uA-1.0 mA, applied for times ranging from approximately 1.0 ns to 1 ms).

In another aspect of the present invention, the polymer memory cell so initialized can be programmed by being subjected to an external stimulus. Such an external stimulus (e.g., electric current or voltage) can be supplied via a control component, and can influence an electrical or optical property associated with the polymer memory cell. The control component can further control the external stimulus, and thereby regulate and/or trace the influenced property of the polymer memory cell. Such programming can typically provide for stability, viability and fast switching of a memory cell's operation at a single or multi-bit level. The polymer memory cell can be programmed to several states x, wherein the number of bits stored per cell n, is a function of x, and the relationship is given as $n=\ln_2(x)$. Such programming can occur by applying a variable time duration positive or negative write pulse, wherein the resistance of the "On" state can be proportional to the energy supplied (above threshold) to the cell. Such variable energy can be supplied to cell by varying the time duration of the write pulse and/or by limiting or setting the current of the write pulse. The number of programmable "On" states can be limited by the required threshold state differences. For example, two to three states per order of magnitude of the ratio for the maximum resistance in the "Off" state divided by the minimum resistance in the full "On" state ($R_{off}/R_{on}$). Moreover, the polymer memory cell so initialized can be read by measuring the incremental resistance at the read voltage—for example, corresponding to a positive or negative field of 0.05–0.3 mega volts per cm.

In a further aspect of the present invention, upon completion of the initialization process, the polymer memory cell can be left in an erase state, or alternatively in a programmed state. The polymer memory cell can initially be left in an erase state, and a very high resistance mode, to mitigate a current drain in the circuit when a device employing such memory cells is first plugged. Alternatively, to mitigate electrostatic damages during product fabrication the polymer memory cells can be placed in a state of low resistance mode (e.g., an "On" state).

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

DETAILED DESCRIPTION OF THE INVENTION

Figure 1A:
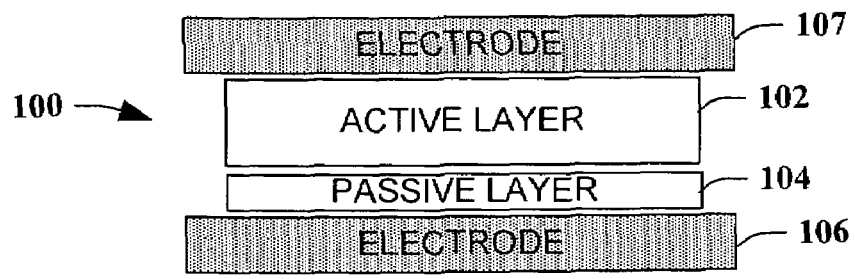
FIGS. 1(a) to 1(c) illustrate a schematic diagram for subjecting a polymer memory cell layers to various stages of an initialization process according to exemplary aspects of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

Figure 1B:
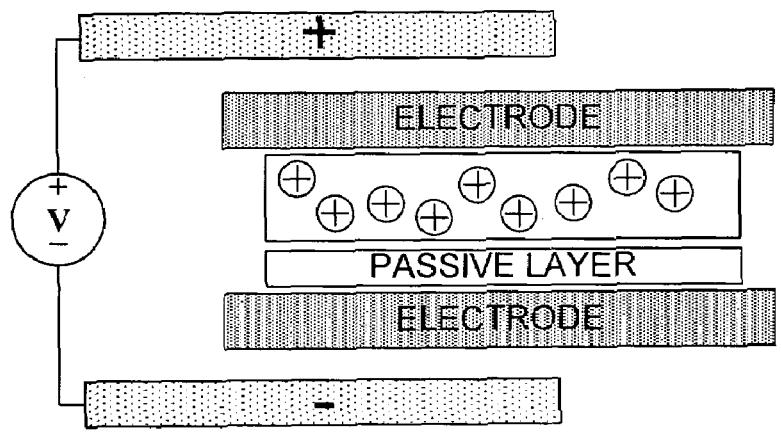
Figure 1C:
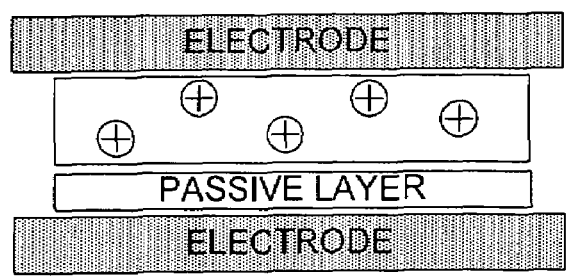

The present invention provides for methods of activating a polymer memory cell(s) after a production thereof by employing an initialization process. Referring initially to FIGS. 1(a) to 1(c), a schematic diagram of an initialization procedure according to one aspect of the present invention is illustrated. FIG. 1(a) illustrates memory cell 100 after the fabrication stage, with an active layer 102 and a passive layer 104 and conductive layers 106 and 107. Upon fabrication and before subjecting such polymer memory cell 100 to an initialization procedure, there typically can be a lack of mobility and/or availability of metal ions (or charged metallic molecules) within the active layer 102 of the polymer memory cell, thus adversely affecting a smooth operation of the memory cell. The memory cell 100 is subjected to an electric field (e.g., a negative (with respect to electrode 107) field) in order to provide a supply of positive ions within the active (e.g., a polymer) layer, as illustrated in FIG. 1(b), such that after removal of the electric field, as illustrated in FIG. 1(c), ample charged carriers exist in the active layer 102 for operation of the memory cell 100. Typically, upon completion of the initialization process, the polymer memory 100 cell can be left in an erase state, or alternatively in a programmed state. For example, the polymer memory cell can initially be left in an erase state, and a very high resistance mode, to mitigate a current drain in the circuit when a device employing such memory cells is first plugged. Alternatively, to mitigate electrostatic damages during product fabrication the polymer memory cell 100 can be placed in a state of low resistance mode (e.g., an "On" state).

In general, such polymer memory cell 100 can include an active layer 102 and a passive (superionic) layer 104 that are sandwiched between conducting layers 106 and 107. The active layer 102 can change an impedance state (e.g., from a high resistance to a low resistance) when subject to a stimulus such as a voltage or current. An active molecule or molecular group forming the active layer can be one that changes a property when subjected to an electrical field and/or light radiation, (e.g., ionizable group), such as: nitro group, amino group, cyclopentadienyl, dithiolane, methlcyclopentadienyl, fulvalenediyl, indenyl, fluorenyl, cyclobis (paraquart-p-phenylene), bipyridinium, phenothiazine, diazapyrenium, benzonitrile, benzonate, benzamide, carbazole, dibenzothiophene, nitrobenzene, aminobenzenesulfonate, aminobenzoate, and molecular units with redox-active metals, including metallocenes (Fe, V, Cr, Co, Ni, and the like) complex, and polypyridine metal complex (Ru, Os, and the like).

In addition, the active layer 102 can include polymers such as polyaniline, polythiophene, polypyrrole, polysilane, polystyrene, polyfuran, polyindole, polyazulene, polyphenylene, polypyridine, polybipyridine, polyphthalocyanine, polysexithiophene, poly(siliconoxohemiporphyrazine), poly (germaniumoxohemiporphyrazine), poly(ethylenedioxythiophene), polyfluorene, polyphenylacetylene, polydiphenylacetylene and related derivatives with an active molecular group. It is to be appreciated that other suitable and related chemical compounds can also be employed including: aromatic hydrocarbons; organic molecules with donor and acceptor properties (N-Ethylcarbazole, tetrathiotetracene, tetrathiofulvalene, tetracyanoquinodimethane, tetracyanoethylene, cloranol, dinitro-n phenyl and so on); metallo-organic complexes (bisdiphenylglyoxime, bisorthophenylenediimine, tetraaza-tetramethylannulene and so on); and porphyrin, phthalocyanine, hexadecafluoro phthalocyanine and their derivatives with an active molecular group.

In a related aspect of the present invention, the active layer can comprise: polymer polyphenylacetylene+molecules of chloranil, tetracyano-quino-dimethane or dichlordicyanoquinone: copper phthalocyanine (which can be deposited by thermal deposition method to about 30 Å–1000 Å); copper hexadecafluoro phthalocyanine, amorphous carbon or palladium (which can be deposited on the upper surface of the active layer by magnetron co-sputtering); polysilanes with N-carbazolylpropyl groups; polymer polytiophene with cyclopentadienyl groups; polysilanes with cyclopentadienyl groups; polysilanes with amino groups; polythiophene with alkyl amino groups; polythiophene with cyclopentadienyl alkyl groups; composite containing polydiphenylacetylene containing carbazolyl groups and dinitro-n-phenyl (DNP); polyethylenedioxythiophene and porous ferroelectric (polyvinyline fluoride) containing $LiCF_3SO_3$ salt; and polyethylenedioxythiophene and salt of potassium hexycyanoferrate.

As depicted in FIG. 1(a), the active layer 102 can be formed over the passive layer 104 on top of a conductive layer 106, to fabricate layers of the polymer memory cell. The active layer 102 can be fabricated via a number of suitable techniques. One such technique involves growing the active layer 102 in the form of an organic layer from the passive layer 104. Likewise, chemical vapor deposition (CVD) techniques can also be employed. Typically, CVD can include low pressure chemical vapor deposition (LPCVD), atmospheric pressure CVD (APCVD), plasma enhanced chemical vapor deposition (PECVD), and high density chemical vapor deposition (HDCVD).

In a related aspect of the present invention, the active layer 102 can also be comprised of a conjugated organic material, such as a small organic molecule and a conjugated polymer. If the organic layer is polymer, a polymer backbone of the conjugated organic polymer may extend lengthwise between conducting layer 106 and a top conducting electrode (not shown) placed on the active layer (e.g., generally substantially perpendicular to the inner, facing surfaces of the conducting layer 106). The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials facilitates control of properties associated with the memory cell fabricated from such layers. In this connection, the conjugated organic material of the active layer 102 has the ability to donate and accept charges (holes and/or electrons), and trap ions. Generally, the conjugated organic molecule has at least two relatively stable oxidation-reduction states. The two relatively stable states permit the conjugated organic polymer to donate and accept charges, when interacting with the passive (superionic) layer. Moreover when employing CVD techniques, it is not generally necessary to functionalize one or more ends of the organic molecule in order to attach it to the passive layer 104. Sometimes such organic molecules can have a chemical bond formed between the conjugated organic polymer of the active layer 102 and the passive layer 104.

In one particular aspect of the present invention, the organic material employed as part of the active layer 102 can be cyclic or acyclic. For some cases, such as organic polymers, the organic material can self assemble during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles; thiol derivatized polyporphyrins; poly(p-phenylene)s; poly(imide)s; polymetallocenes, such as polyferrocenes, polyphthalocyanines, polyvinylenes, polystiroles, and the like. Additionally, the properties of the organic material can be modified by doping with a suitable dopant.

Such organic material, which in one exemplary aspect can form the active layer 102, has a suitable thickness that depends upon the chosen implementations of the memory cell being fabricated. Some suitable exemplary ranges of thickness for the organic polymer layer, which in part can form the active layer 102, are about 10 nm or more and about 200 nm or less. Similarly, the passive layer 104 can have a suitable thickness that can vary based on the implementation of the memory cell being fabricated. Some examples of suitable thicknesses for the passive layer 104 can be: a thickness of about 5 nm or more and about 200 nm or less.

According to one aspect of the present invention, the passive layer can be selectively grown, spun-on, deposited upon the conducting layer 106 via CVD, vacuum thermal evaporation, sputtering, or plasma enhanced chemical vapor deposition (PECVD) utilizing a metal organic (MO) precursor. The deposition process can be monitored and controlled to facilitate, among other things, depositing the conductivity facilitating compound to a desired thickness.

Additionally, the passive layer 104 facilitates metal ion injection into the active layer 102 and increases the concentration of metal ions in the active layer 102 that can modify the conductivity of the active layer 102.

The passive layer 104 contains at least one conductivity-facilitating compound that has the ability to donate and accept ions. Generally, the conductivity-facilitating compound has at least two relatively stable oxidation-reduction states that can permit the conductivity-facilitating compound to donate and accept ions. Examples of other conductivity-facilitating compounds that can be employed for the passive layer 104 include one or more of the following: tungsten oxide ($WO_3$), molybdenum oxide ($MoO_3$), titanium selenide ($TiSe_2$), one or more of copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$), iron oxide ($Fe_3O_4$), and the like. The passive layer 104 may be grown using oxidation techniques, formed via gas phase reactions, or deposited between conducting electrodes of a polymer memory cell. It is to be appreciated that the invention is not so limited and other conducting and/or semi conducting materials can also be employed. The passive layer 104 has a suitable thickness that can vary based on the implementation and/or memory device being fabricated. The passive layer 104 can in some instances act as a catalyst when forming the active layer 102. In this connection, a backbone of a conjugated organic molecule can initially form adjacent the passive layer 104, and grow or assemble away and substantially perpendicular to the passive layer surface. As a result, the backbones of the conjugated organic molecule can be self aligned in a direction that traverses the conducting layer 106 (e.g., copper electrode). The passive layer 104 can be formed by a deposition process (e.g., thermal deposition, PVD, non-selective CVD, and the like) or by a complete sulfidation of a-pre-deposited thin Cu layer.

Figure 2:
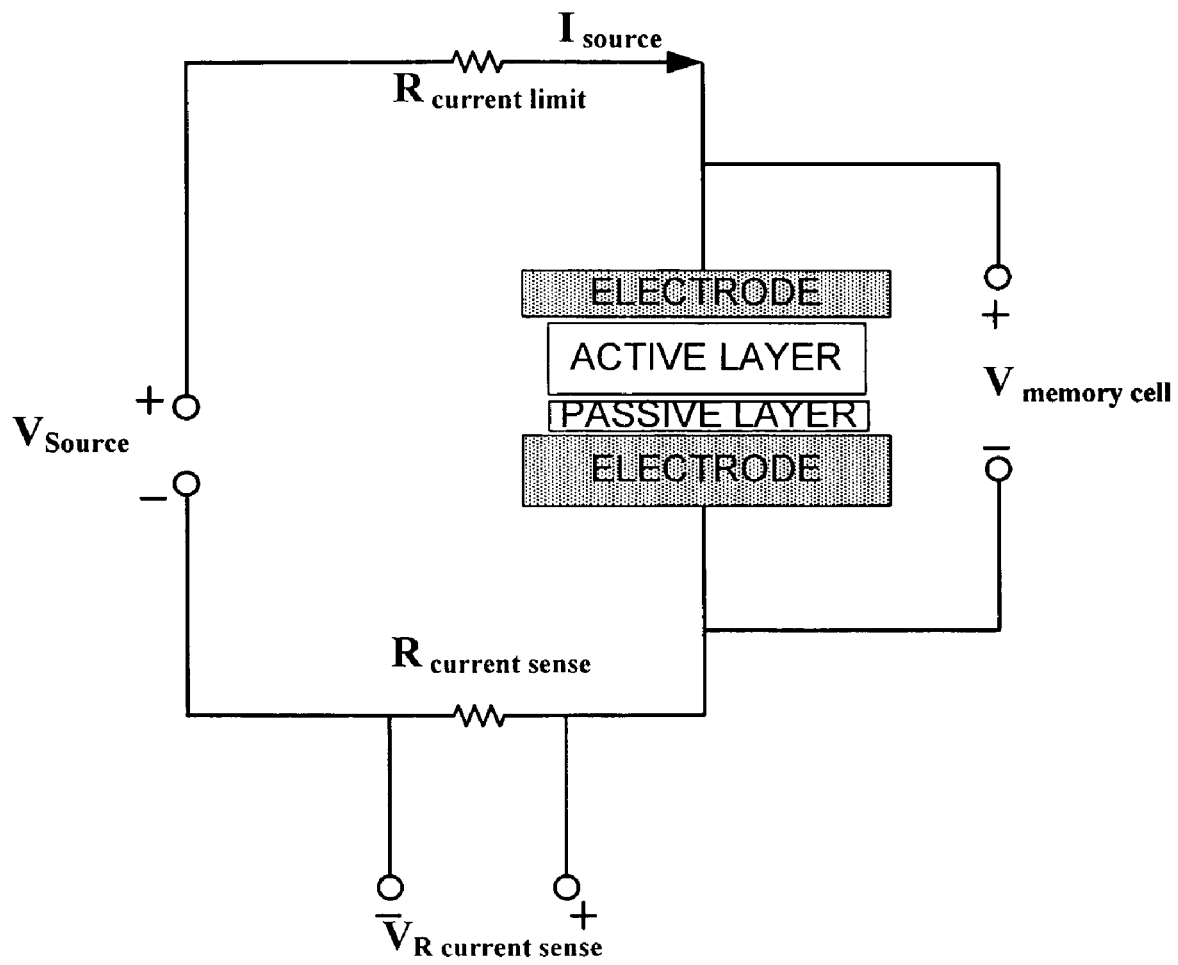
FIG. 2 depicts a system for initializing the polymer cell according to an aspect of the present invention.

Turning now to FIG. 2, a system 200 is illustrated for subjecting the memory cell 200 to an electric field for an operation (e.g., programming, read) thereof. To determine what state the memory cell is in its resistance can be checked. In general, and as a simple model, the memory cell can act as a variable resistor, and to measure its resistance a very small voltage can be applied to the resistor and a flowing current measured. As illustrated in FIG. 2 for the cell operation bias $$i_{Source} = V_{R\ current\ sense}/R_{current\ sense} \text{(and wherein } R_{current\ limit} \gg R_{current\ sense})$$

Figure 3:
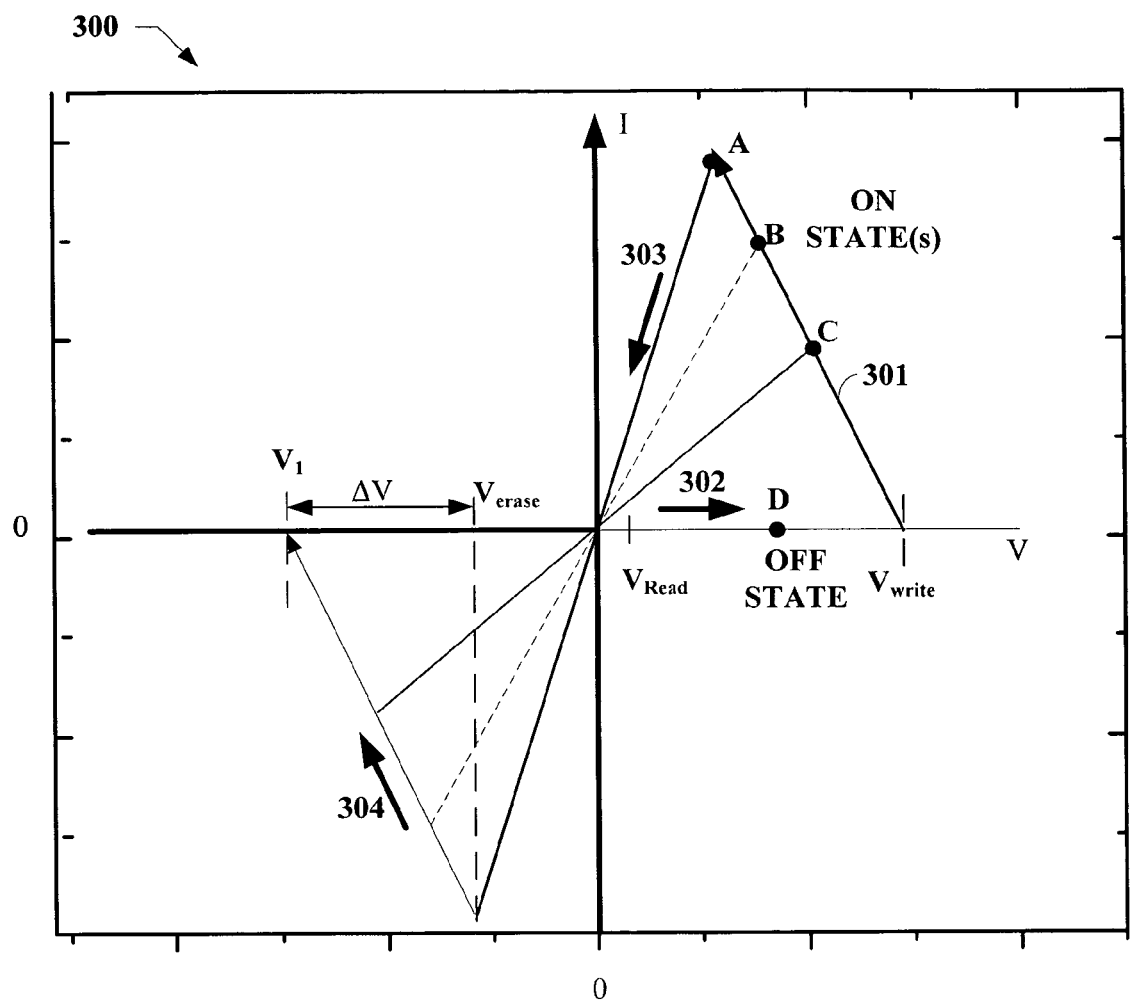
FIG. 3 illustrates an exemplary current-voltage graph for a dual bit polymer memory cell, during three "On" states and a single "Off" state.

FIG. 3 illustrates an exemplary current-voltage graph 300 for a dual bit polymer memory cell having a lower copper bottom electrode, during three "On" states and a single "Off" state; for example in a binary representation of "11", "10", "01", and "00". Typically, a polymer memory cell can be programmed to several "On" states x, and wherein n is a number of bits stored per cell and determined from $n=\ln_2(x)$. Thus, should there be a requirement to store three bits per cell, then a total of seven ($2^3-1$) identifiable "On" states, as well as one "Off" state can be required.

For the polymer memory cell with the electrode illustrated in FIG. 1(*a*), an erase direction can be defined as applying a negative voltage to the lower electrode 106, and a programming direction can be defined as applying a positive voltage to the lower electrode 106. The programming can occur by applying a variable time duration positive (with regards to electrode 106) write pulse, wherein the resistance of the "On" state can be proportional to the non-Joule energy supplied to the cell. For example, by limiting the electrical field and applied voltage the polymer memory cell can be programmed to several different "On" resistances, marked as points A, B, C and an "Off" state marked as point D. Such Point D can associate with a very high resistance ($R_{off}$), which for example can be beyond practical measurements.

Upon switching the memory cell, and when the voltage is decreased the polymer memory cell can be turned to an initial "On" state (C). Similarly, by limiting the current in a controlled manner, other "On" states (points A, B) can be programmed into the polymer memory cell (e.g., by employing various transistor circuits to control the current). For example, points A, B, and C can correspond to $10^3$ Ohms, $10^4$ Ohms, and $10^5$ Ohms respectively. As such, the number of programmable "On" states can be limited by the required threshold state differences. For example, two to three states per order of magnitude of the ratio for the maximum resistance in the "Off" state divided by the minimum resistance in the full "On" state ($R_{off}/R_{on}$). Moreover, the polymer memory cell so initialized can be read by measuring the incremental resistance at the read voltage—for example, corresponding to a positive (with regards to electrode 106) field of 0.05–0.3 mega volts per cm.

As explained supra, the "On" and "Off" states can be distinguished by choosing a current and measuring a respective voltage and vice versa, and the memory cell can exhibit an I-V graph that is symmetrical with respect to the point of origin. As illustrated in FIG. 3, slope of line 301 typically can reflect the current limiting resistance of the circuit (e.g., reflecting a load line that can be varied by a combination of the applied voltage and a resistance in series with the memory component). Such line depicts a typically transitional state when switching the device.

If the voltage is increased in a direction of the arrow 302 by tracing the "Off" state such that the a write voltage threshold ($V_{write}$) is obtained, the memory cell then switches from an "Off" state of high resistance to an "On" state of low resistance. The value of such $V_{write}$ for the very next cycle of programming can be customized, based on a voltage applied in an erase direction beyond the erase threshold, for example to a level $V_1=V_{erase}+\Delta V$. The write voltage for the next programming cycle of the polymer memory cell can generally vary as a direct proportional linear function of the difference in voltage over the erase threshold $\Delta V$).

As illustrated upon reaching an "On" state, a decrease of voltage traces in a direction of arrow 303 into negative voltage values following a path of the "On" state Thereafter, an erase voltage threshold point ($V_{erase}$) can be obtained that can then switch the device from an "On" state to an "Off" state as depicted by arrow 304. Nonetheless, if before reaching such erase threshold voltage the voltage is reversed the I-V trace will retrace back on the "On" state curve in a direction opposite the arrow 303. If the erase threshold is surpassed in the negative voltage direction, any voltage reversal typically will follow the "Off" state curve, and the corresponding threshold write voltage will be increased for the next programming cycle. Accordingly, by varying the voltage applied beyond the erase threshold (e.g., to a range of ±10 volts), desired threshold write voltages can be obtained to satisfy circuit requirements, wherein the farther in the erase direction a voltage is applied to the memory cell (e.g., the "harder" the erase reached), then the higher is the programming voltage required for the next cycle of the polymer memory cell. Such customization can increase flexibility in circuit design and enables design of circuits according to a user's preference.

Figure 4:
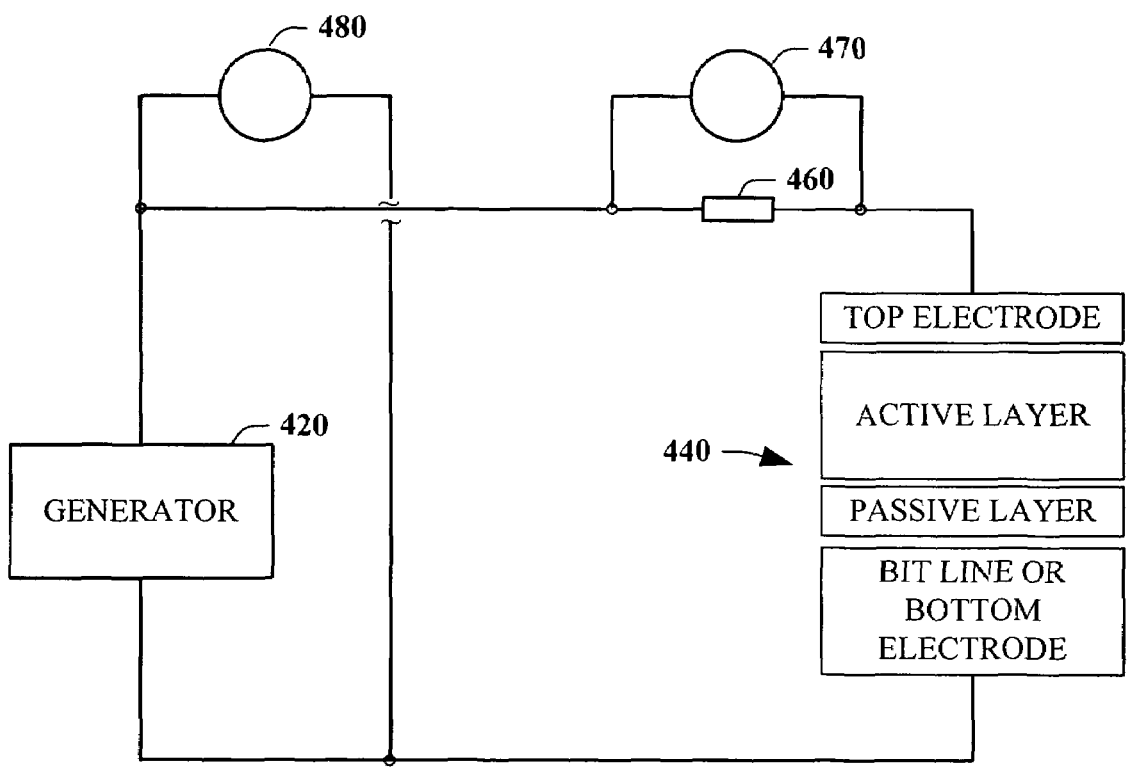
FIG. 4 illustrates a particular circuit for programming a polymer memory cell according to one aspect of the present invention.

Referring now to FIG. 4, a circuit that programs a memory cell 440 having passive and active layers that are subjected to an initialization process to provide a supply of positive ions within the polymer active layer according to one aspect of the present invention is illustrated. The control system for programming the memory cell 440 includes a generator 420 that can provide a controllable electrical current level (e.g. a programmable current) during information writing and/or recording of the memory cell 440. The memory cell 440 includes two electrodes that sandwich various passive and active layers therebetween, as described in detail infra. It is to be appreciated that the present invention is not so limited and other layers such as various barrier layers can also be employed.

A ballast resistor 460 is operatively connected to the memory cell 440 thereby tending to limit the current independent of any resistance variations of the memory cell 440. Registering devices 470 and 480 can monitor circuit conditions during various programming stages of the memory cell 440. For example, the value of the current flowing through the memory cell can be obtained by measuring voltage on the ballast resistor 460, and such registering device can include voltmeters, oscillographs, recorders and other devices employed for monitoring circuit conditions at any moment.

Figure 5:
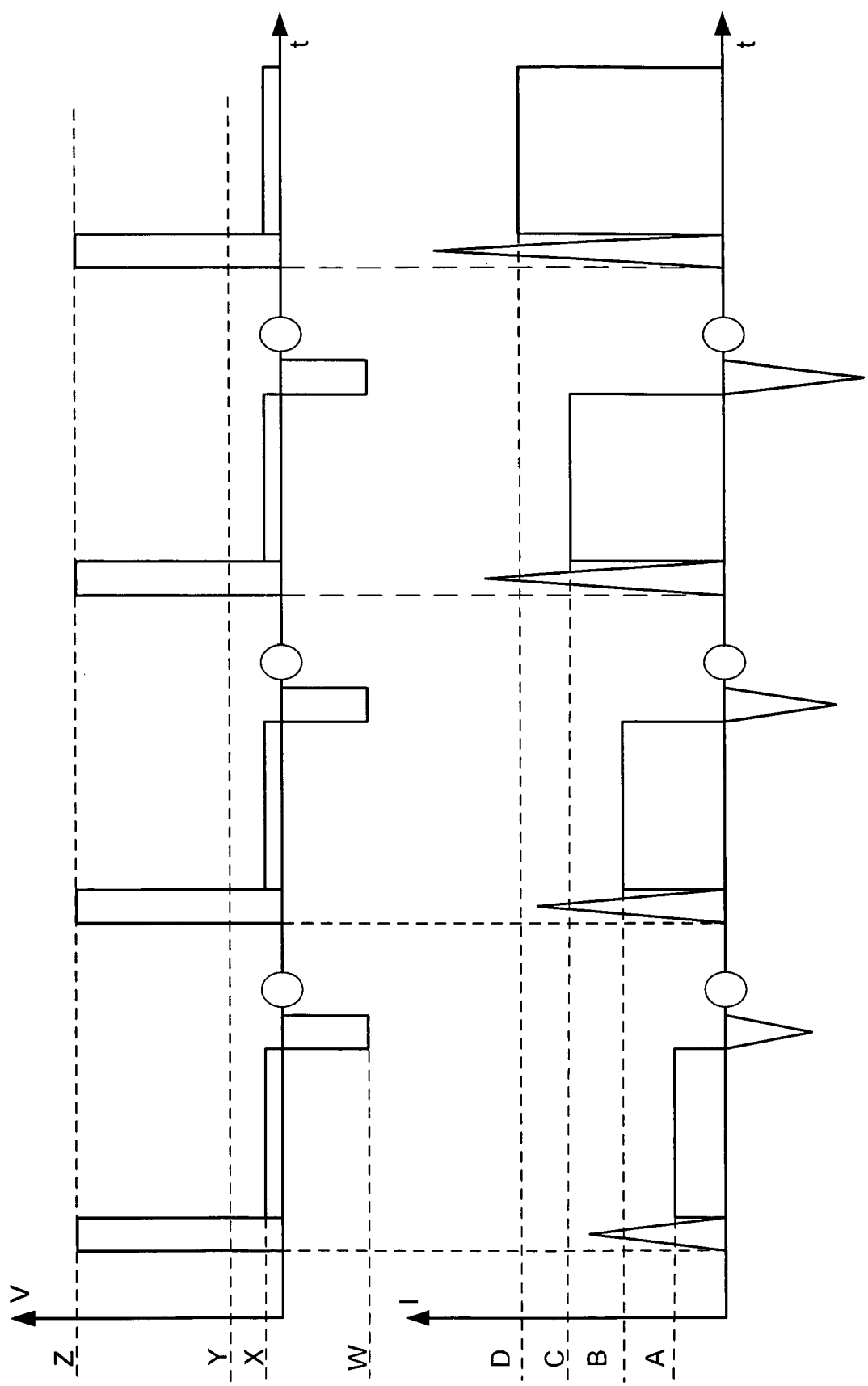
FIG. 5 illustrates associated voltage-time and current-time graphs of a methodology for writing a two bit memory cell operation, in accordance with a particular aspect of the present invention.

According to one particular methodology of the present invention, the generator 420 forms an initial voltage pulse that exceeds a threshold reference (e.g., voltage value) required for programming a memory cell. For example, FIG. 5 illustrates associated voltage-time and current-time graphs of such a methodology for writing a two bit memory cell operation. Voltage levels "Z" and "Y" depict an initial voltage pulse and a threshold voltage respectively. The values of the current flowing through the memory cell 440 can then be obtained by measuring voltage on the ballast resistor 460. As such, current flowing through the memory cell can be controlled such that the various electric current pulse states correspond to respective bits of information, written in to the memory cell. For example and as depicted in FIG. 5, electric current level "A" can designate a value "00", electric current level "B" can designate a value "01", electric current level "C" can designate a value "10", and electric current level "D" can designate the value "11", all which are programmable into the memory cell 440.

Next, and after the electric current pulse reaches the desired programmed state, the write programming is complete, and the programming voltage switched off. Similarly, to read bits of information from the memory cell 440, a reading voltage "X" that is lower than the threshold voltage value "Y" is generated via the generator 420. Based on the amount of current flowing through the ballast resistor 460 of FIG. 4, the resistance of the memory cell 440 can then be estimated, and an electric current flowing through it obtained. Such electric current can then correspond to a reference electric current, to verify a programmed state of the memory cell. Likewise, to erase information, the generator 420 creates a negative voltage pulse W, which can create a current, controlled to reach an erase threshold value flowing through the memory cell. It is to be appreciated that other properties besides voltage, current, or impedance can be employed to program a memory cell having a functioning zone. For example, the controlled value can be an intensity of light (optical programming when light sensor/emitter layers are employed), or amount of time that the memory cell is subject to an external stimulus and/or signal. Such can also depend upon the structure of a particular memory cell, and material employed in its fabrication. As for the particular memory structure illustrated by FIG. 4, it may be necessary to return the cell to its initial state and erase recorded information before a further write operation can be performed.

Figure 6:
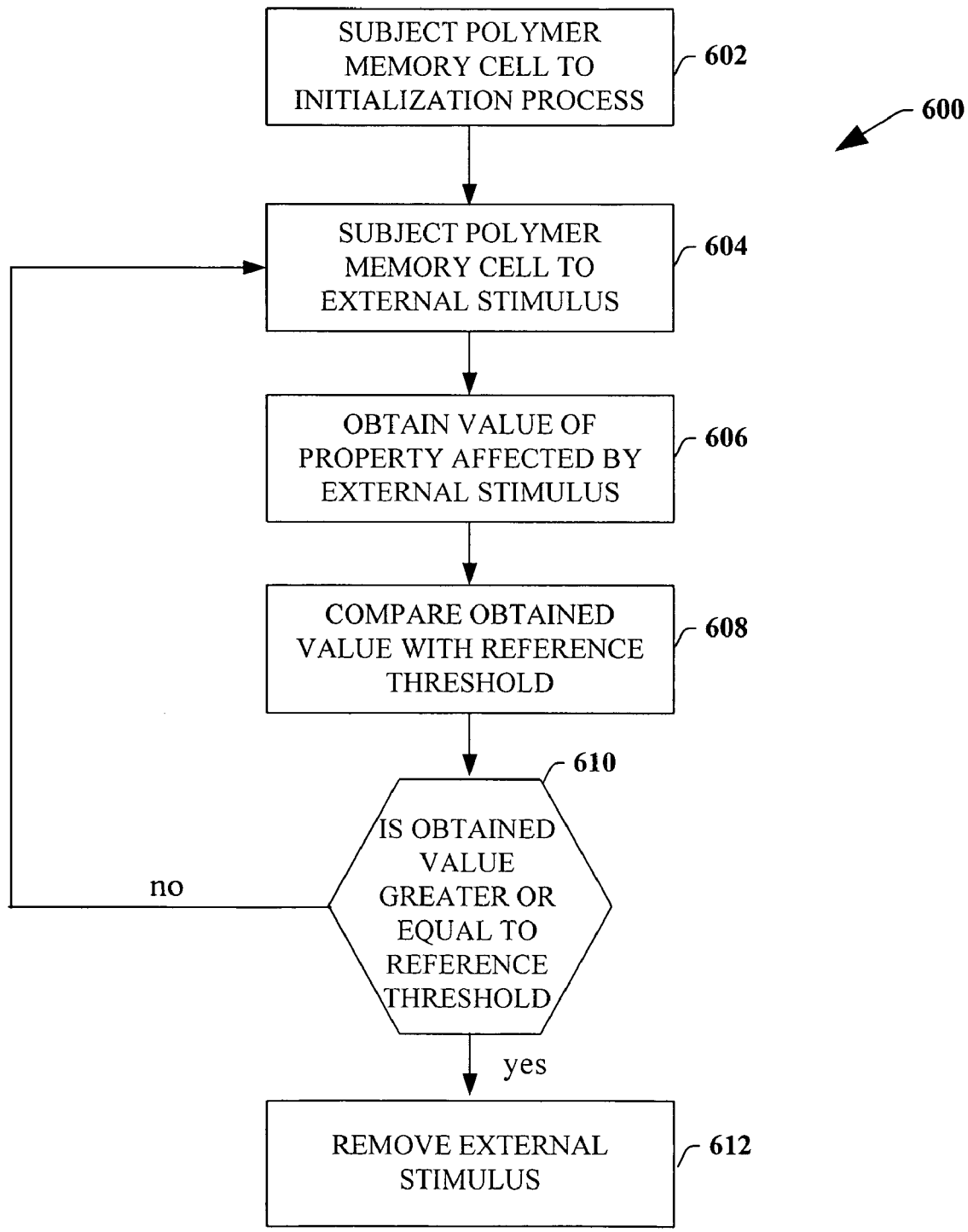
FIG. 6 illustrates a methodology for programming a memory cell according to one or more aspects of the present invention.

Referring now to FIG. 6, a flow diagram illustrates a methodology 600 for programming a memory cell according to one or more aspects of the present invention. The methodology begins at 602 wherein the active and passive layers are subject to an initialization process as described in detail supra. Such a process can facilitate the distribution and mobility of metal ions (or charged metallic molecules) within an active layer of the polymer memory cell. Moreover, such treatment can also facilitate controlling a distribution of various thresholds (e.g., write and erase threshold), and set them to predetermined values.

Next and at 604, the memory cell to be programmed receives an external stimulus (e.g., current or voltage). Such an external stimulus can be supplied via a control component, and can change an electrical and/or optical property (ies) associated with the memory cell. The control component can further monitor/regulate the external stimulus, and thereby control the influenced property of the memory cell. At 606, the value of property thus affected can be obtained (e.g. calculated and/or measured). Subsequently at 608, the obtained value is compared (e.g. via a comparator of the control system) to a reference threshold determined for that particular property. Such reference threshold can set an upper limit associated with a particular programming state for the memory cell having a functional zone to be programmed. It is to be appreciated that other electrical/optical features that are dependent on the affected property can also be compared to respective predetermined values, and employed as reference criteria for verifying the program state.

Next, the process progresses to comparing step 610, if the value of the affected property exceeds or is equal to the reference threshold, then programming for such state is considered complete. The method then removes the external stimulus at 612, and ends at 614. Otherwise, the program returns to subjecting the memory cell to a new stimulus. It is to be appreciated that the reference threshold can also set a lower limit associated with a particular programming state. Moreover, the threshold reference can also constitute a range, and the comparison step verifies whether the affected property of the memory cell falls within the range or not. While the exemplary method is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated herein, in accordance with the invention. For example, the memory cell can be subject to a stimulus that facilitates reading bits of information, as opposed to writing or erasing. In addition, not all illustrated blocks, events or acts, may be required to implement a methodology in accordance with the present invention. Moreover, it will be appreciated that the exemplary method and other methods according to the invention may be implemented in association with programming the memory cell illustrated and described herein, as well as in association with other systems and apparatus not illustrated or described.

Figure 7:
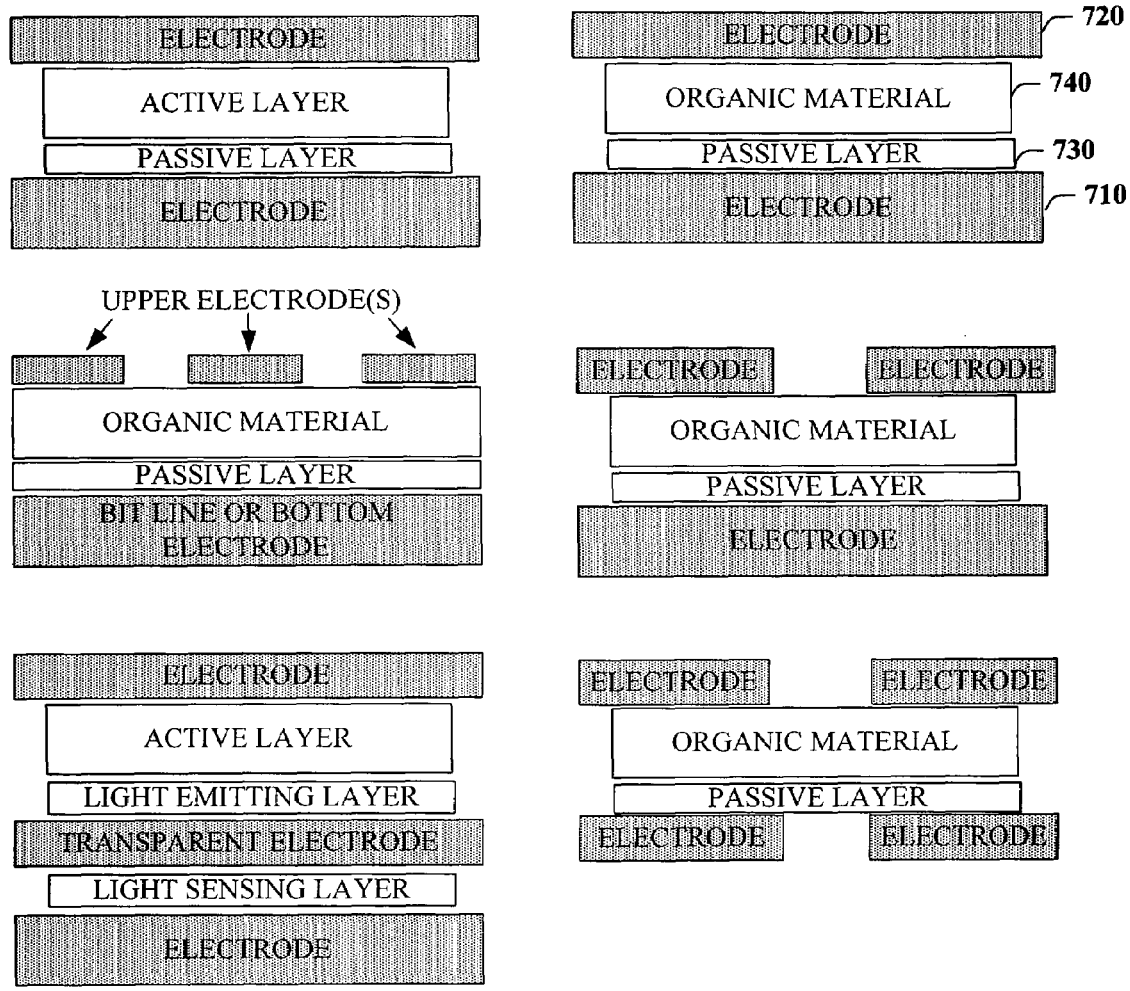
FIG. 7 illustrates structures of memory cells with various exemplary electrode arrangements and passive/active layers that can be subject to an initialization process according to one aspect of the present invention.

Referring now to FIG. 7, structures of memory cells are illustrated having various exemplary electrode arrangements and passive/active layers that can be subject to an initialization process of the present invention. Typically for such memory cells, upper and lower electrodes sandwich various other active and passive layers, as described supra. The electrodes (e.g. 710, 720) can be comprised of a conductive material such as aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the electrodes can vary depending on the implementation and the memory device being constructed. However, some exemplary thickness ranges include about 100 nm or more and about 10 μm or less for 710 and 720. The electrodes can be placed in an alternating fashion among various layers of, for examples semiconductor layers, polymer layers, and passive layers.

As explained supra, the passive layer 730 is operative to transport ions from electrode 710 to the interface between the active (e.g., organic) layer 740 and the passive layer 730. Additionally, the passive layer 730 facilitates ion injection into the active layer 740 and increases the concentration of the ions in the active layer resulting in a modification of the conductivity of the active layer 740. In addition, the passive layer 730 can in some instances act as a catalyst when forming the active layer 740. In this connection, a backbone of the conjugated organic molecule may initially form adjacent the passive layer 730, and grow or assemble away and substantially perpendicular to the passive layer surface. As a result, the backbones of the conjugated organic molecule may be self aligned in a direction that traverses the two electrodes. The discussion infra describes and illustrates ionic concentration and models behavior of such organic memory devices.

In the following example, the active layer is conductive polymer with organic material, and $Cu_2S$ is used as passive layer material. It has a relatively strong capability to gain electrons from a contacting polymer and yields the following equations:

$$Cu_2S \rightarrow Cu + Cu_{1.99}S, \text{ and } Cu \rightarrow Cu^+ + e^-$$

Figure 8:
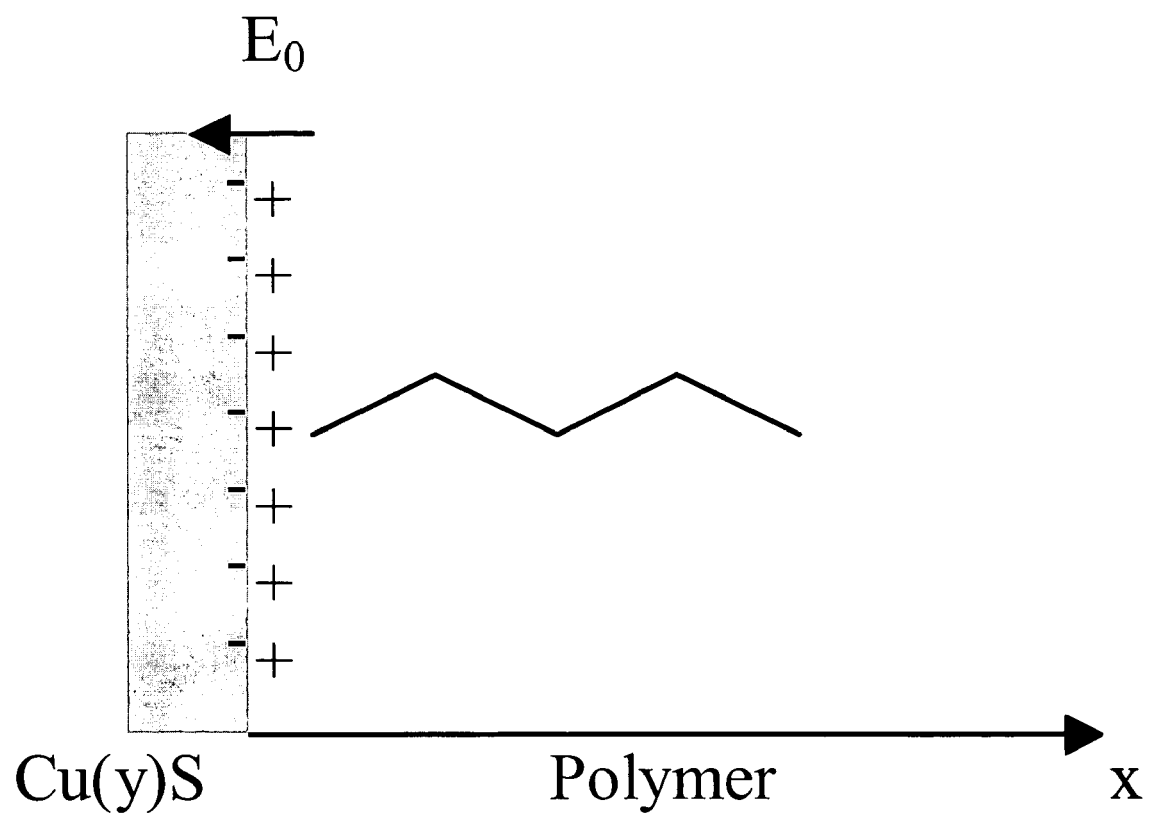
FIG. 8 is a graph depicting the effect of an intrinsic electric field on an interface between the passive and active layers of a memory cell, initialized in accordance with an aspect of the present invention.

The consequence is that an intrinsic field is produced due to the charges accumulated on the interface between CuS and polymer. This is shown in FIG. 8, which is a graph depicting the effect of an intrinsic electric field on an interface between $Cu(y)S$ (with y accepting a suitable value, e.g., from 1 to 2) and a polymer is provided. The oxidized copper ($Cu^+$) is the charge carrier when an external field is applied. The conductivity of a polymer is determined by its concentration and its mobility using the following equation:

$$\sigma = qp\mu$$

where q is the ionic charge, p is ion concentration and μ is the mobility.

Figure 9:
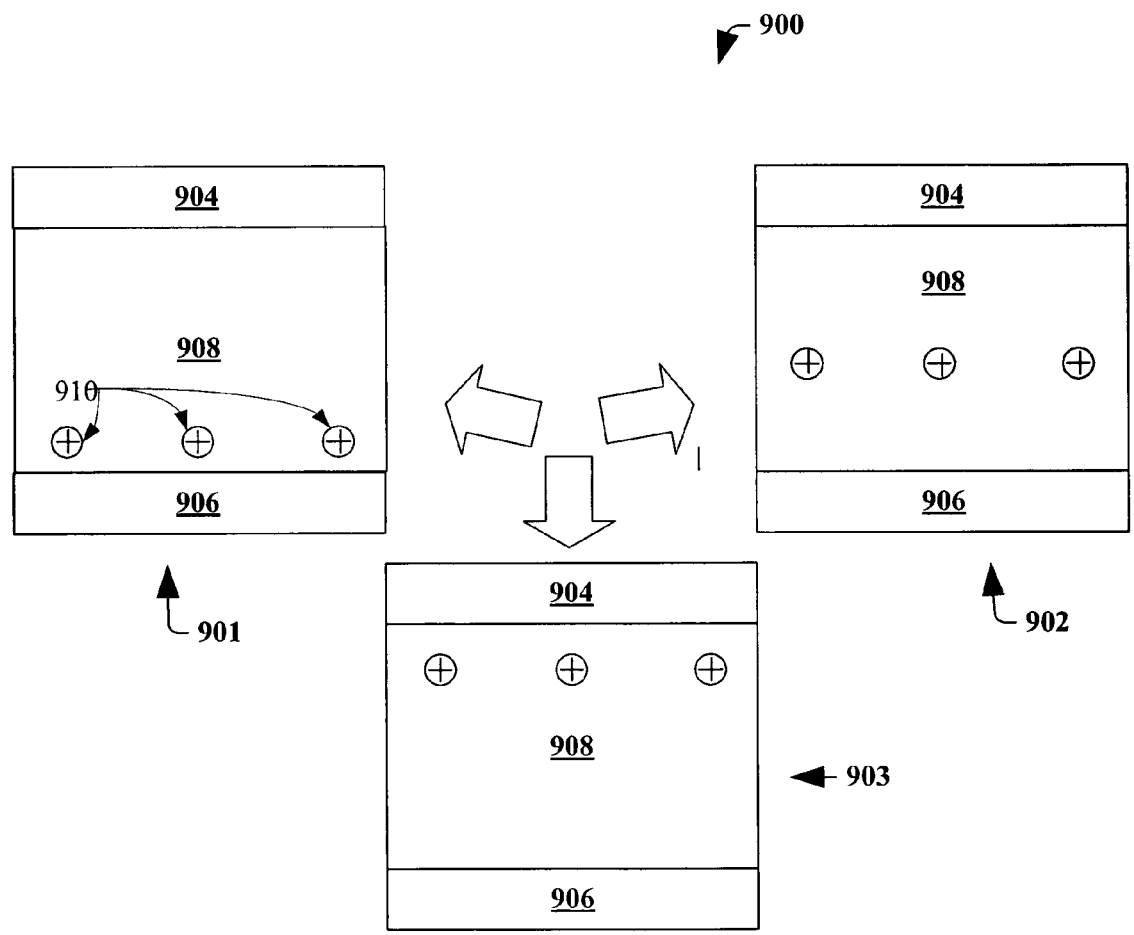
FIG. 9 is a schematic diagram that illustrates a polymer memory device in various states accordance with an aspect of the present invention.

FIG. 9 is a schematic diagram that illustrates a polymer memory device 900 in various states (901, 902 and 903) in accordance with an aspect of the present invention. The device 900 is depicted in a first "Off" state 901, an "On" state 902, and a second "Off" state 903. It is appreciated that memory devices formed in accordance with the present invention can have other states than those depicted in FIG. 9. The organic memory device 900 comprises a top electrode 904, a bottom electrode 906 and a selectively conductive layer 908 comprising an organic layer (e.g., PPA) and at least one passive layer (e.g., $Cu_2S$). In the first "Off" state 901, charges (e.g., positive ions) 910 collect in the selectively conductive layer 908 near the bottom electrode 906. In the "On" state 902, the charges 910 are uniformly distributed thereby indicating an "On" state. In the second "Off" state 903, the charges collect in the selectively conductive layer 908 near the top electrode 904.

Figure 10:
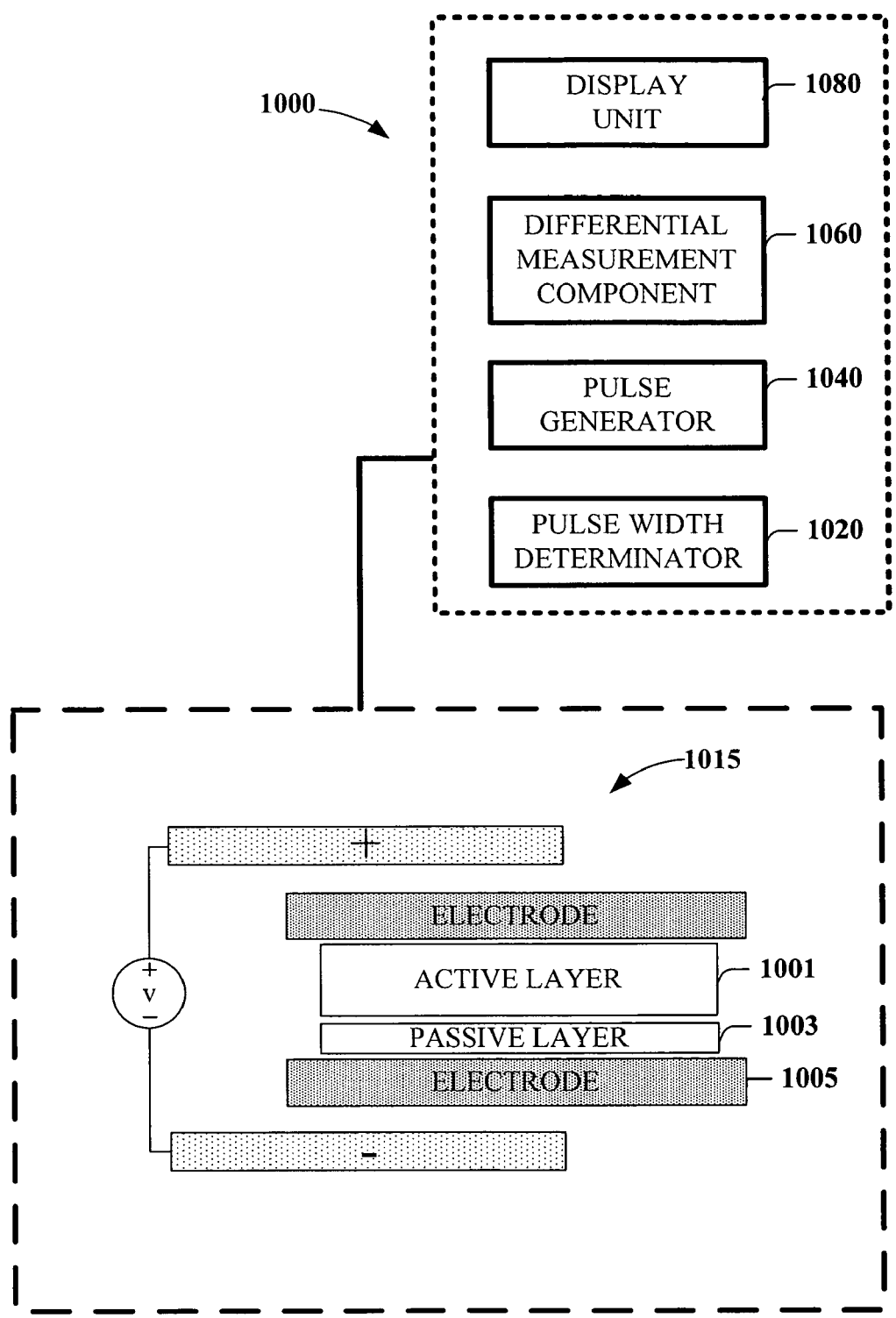
FIG. 10 depicts a schematic diagram of a polymer memory cell having associated programming thresholds set based on a system according to one aspect of the present invention.

FIG. 10 depicts a schematic diagram of a polymer memory cell 1015 having associated programming thresholds set based on system 1000 according to one aspect of the present invention. Typically, if the lower electrode 1005 is a copper electrode an erase direction for such memory cell can be defined as applying a negative voltage to its copper electrode. Like wise, a programming direction for the memory cell with a lower copper electrode can be defined as applying a positive voltage to the copper electrode. The programming threshold adjustor system 1000 can comprise: a pulse width determinator 1020, a pulse generator 1040 (e.g., triangular, square pulse, or combination mode wave generators), differential voltage/current measurement components 1060 with sense amplifiers, and a display 1080 that can monitor various control parameters (e.g., voltage, current, pulse width, and the like) as part of programming and/or setting the program threshold of the polymer memory cell 1015. In addition, the polymer memory cell 1015 can be part of an array formed on a silicon-based wafer, and can include a plurality of rows (not shown) referred to as bit lines and a plurality of columns (not shown) referred to as wordlines. The intersection of a bit line and a word line constitutes the address of a particular memory cell, which can have a programming voltage adjusted via the system 1000.

Figure 11:
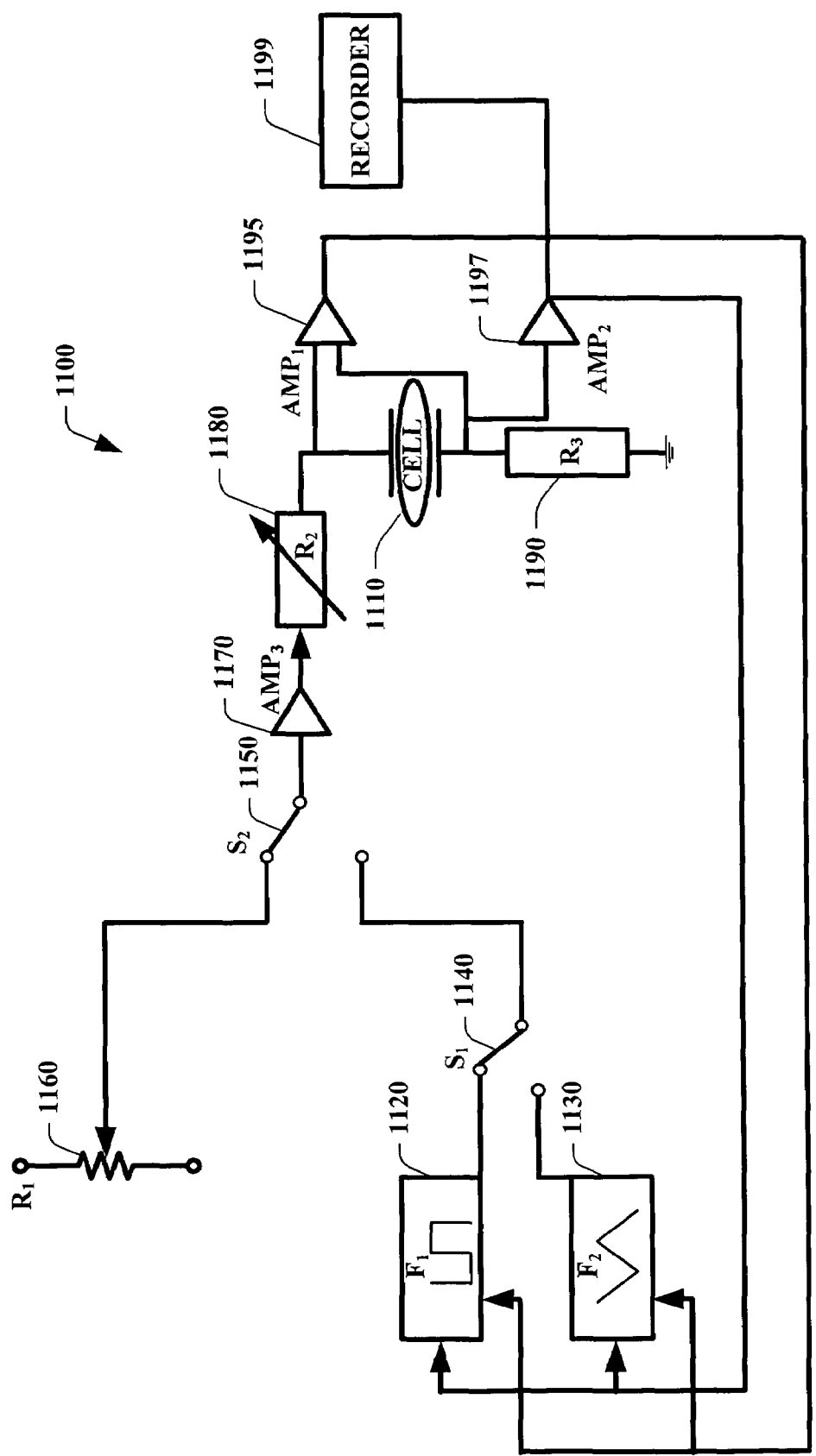
FIG. 11 illustrates a block diagram of a system for test and operation of a memory cell, in accordance to an exemplary aspect of the present invention.

FIG. 11 illustrates a block diagram of a system 1100 for test and operation of a memory cell 1110. The system 1100 includes a wave generator ($F_1$) 1120 capable of forming wave pulses (square), wherein a desired frequency and amplitude can be selected. A triangle wave pulse generator ($F_2$) 1130 can also be employed alone or in conjunction with generator 1120, wherein a desired frequency and amplitude can also be selected to test an operation of the memory cell 1110. Switches 1140 and 1150 ($S_1$ and $S_2$) can select the manual or auto mode for test and operation of the memory cell 1110. A resistance ($R_1$) 1160 can adjust a manual voltage sweep range for the system 1100. In addition, an amplifier ($AMP_3$) 1170 can be employed to indicate a voltage/current gain for operation of the memory cell 1110. Also, the resistor ($R_2$) 1180 can function as a selectable current limiting resistor and the resistor ($R_3$) 1190 as a current sampling resistor. Moreover, an amplifier ($AMP_1$) 1195 can provide for isolation of differential voltage measurement across the memory cell 1110 and provide feed back to wave generators ($F_1$ and $F_2$) 1130 and 1120. Similarly, an amplifier ($AMP_2$) 1197 can provide for isolation of current measurement through the memory cell 1110 and provide feed back to wave generators ($F_1$ and $F_2$) 1130 and 1120. A multi channel instrument 1199 can record and display electric current, voltage, and the like as a function of time throughout the test of an operation of the memory cell 1110.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

What is claimed is:

1. A method of programming information in a polymer memory cell comprising:
   initializing the polymer memory cell, comprising:
   subjecting the polymer memory cell to a positive or negative electric field to provide a supply of ions and facilitate mobility of the ions within an active layer thereof, the polymer memory cell comprising the active layer and a passive layer situated between electrodes,
   setting one or more predetermined threshold values to facilitate programming, and
   removing the electric field when charged carriers exist in the active layer and the one or more predetermined threshold values are set;
   applying an electric field pulse that exceeds a predetermined threshold value to the polymer memory cell; and
   controlling at least one of an impedance of the polymer memory cell and current flowing through the polymer memory cell, to program the polymer memory cell.

2. The method of claim 1 further comprising comparing a current flowing through the polymer memory cell with a predetermined threshold value.

3. The method of claim 1 further comprising removing the electric field pulse based on an outcome of comparing a current flowing through the cell with a predetermined threshold value.

4. The method of claim 1 further comprising applying a further electric pulse to read information from the polymer memory cell.

5. The method of claim 1 further comprising applying a reverse electric field pulse to erase programmed information.

6. The method of claim 1, the electric field with a strength of 2–4 megavolts per centimeter.

7. The method of claim 1, the active layer is a polymer layer.

8. The method of claim 1, further comprising forming the active layer via a chemical vapor deposition process.

9. The method of claim 1, the active layer comprises metal particles and/or metal containing molecular groups.

10. The method of claim 9, the metal containing molecular groups comprise molecular units with at least one of: redox active metals, metallocenes complex, or polypyridine metal complex.

11. The method of claim 1, the active layer comprises at least one of: polyaniline, polythiophene, polypyrrole, polysilane, polystyrene, polyfuran, polyindole, polyazulene, polyphenylene, polyfluorene, polypyridine, polybipyridine, polyphthalocyanine, polysexithiofene, poly(siliconoxohemiporphyrazine), poly(germaniumoxohemiporphyrazine), or poly(ethylenedioxythiophene) or copolymers thereof.

12. The method of claim 1, the active layer comprises at least one of: hydrocarbons, organic molecules with donor and acceptor properties, metallo-organic complexes, porphyrin, phthalocyanine, or hexadecafluorophthalocyanine.

13. The method of claim 12, the organic molecules with donor and acceptor properties comprises at least one of: N-Ethylcarbazole, tetrathiotetracene, tetrathiofulvalene, tetracyanoquinodimethane, tetracyanoethylene, cloranol, or dinitrophenyl.

14. The method of claim 12, the metallo-organic complexes are selected from the group of bisdiphenylglyoxime, bisorthophenylenediimine, and tetraaza-tetramethylannulene.

15. The method of claim 1, the active layer comprises organic material selected from the group comprising of polyacetylene, polyphenylacetylene, polydiphenylacetylene, polyaniline, poly(p-phenylene vinylene), poly(phenylene), poly(fluorene), polythiophene, polyporphyrins, porphyrinic macrocycles, thiol derivatized polyporphyrins, polymetallocenes, polyferrocenes, polyphthalocyanines, polyvinylenes, and polystiroles.

16. The method of claim 1, the active layer comprises material selected from the group comprising of electric dipole elements, polymer ferroelectrics clusters, non-organic ferro-electrics, salts, alkalis, acids, and water molecules.

* * * * *